(12) United States Patent
Tolle et al.

(10) Patent No.: US 9,474,163 B2
(45) Date of Patent: Oct. 18, 2016

(54) GERMANIUM OXIDE PRE-CLEAN MODULE AND PROCESS

(71) Applicant: ASM IP HOLDING B.V., Almere (NL)

(72) Inventors: John Tolle, Gilbert, AZ (US); Matthew G. Goodman, Chandler, AZ (US)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/586,438

(22) Filed: Dec. 30, 2014

(65) Prior Publication Data

US 2016/0192502 A1  Jun. 30, 2016

(51) Int. Cl.
| | |
|---|---|
| B05D 3/02 | (2006.01) |
| B05D 3/04 | (2006.01) |
| H05K 3/00 | (2006.01) |
| H01L 21/02 | (2006.01) |
| H01L 21/306 | (2006.01) |
| B05D 3/00 | (2006.01) |

(52) U.S. Cl.
CPC ......... *H05K 3/0085* (2013.01); *H01L 21/0206* (2013.01); *H01L 21/02041* (2013.01); *H01L 21/306* (2013.01); *B05D 3/002* (2013.01); *B05D 3/02* (2013.01); *B05D 3/04* (2013.01); *B05D 3/0433* (2013.01)

(58) Field of Classification Search
CPC ...... H05K 3/0085; B05D 3/002; B05D 3/04; B05D 3/0433; B05D 3/02; H01L 21/02041; H01L 21/02057; H01L 21/0206; H01L 21/306
USPC ........................................................ 427/299
See application file for complete search history.

(56) References Cited

U.S. PATENT DOCUMENTS

| | | | |
|---|---|---|---|
| 4,361,461 A | 11/1982 | Chang | |
| 4,517,223 A | 5/1985 | Ovshinsky et al. | |
| 4,615,905 A | 10/1986 | Ovshinsky et al. | |
| 4,632,057 A | 12/1986 | Price et al. | |

(Continued)

FOREIGN PATENT DOCUMENTS

JP  02-256235  10/1990

OTHER PUBLICATIONS

Office Action from co-pending U.S. Appl. No. 14/220,001 mailed on Jun. 30, 2015 in 12 pages.

(Continued)

*Primary Examiner* — Kirsten Jolley
(74) *Attorney, Agent, or Firm* — Knobbe, Martens, Olson & Bear LLP

(57) ABSTRACT

In some embodiments, a method for integrated circuit fabrication includes removing oxide material from a surface of a substrate, where the surface includes silicon and germanium. Removing the oxide material includes depositing a halogen-containing pre-clean material on a silicon oxide-containing surface and sublimating a portion of the halogen-containing pre-clean material to expose the silicon on the surface. A passivation film is deposited on the exposed silicon. The passivation film may include chlorine. The passivation film may prevent contamination of the silicon surface by chemical species from the later sublimation, which may be at a higher temperature than the earlier sublimation. Subsequently, a remaining portion of the halogen-containing pre-clean material and the passivation film are sublimated. A target material, such as a conductive material, may subsequently be deposited on the substrate surface.

34 Claims, 4 Drawing Sheets

(56) References Cited

U.S. PATENT DOCUMENTS

| | | |
|---|---|---|
| 4,699,689 A | 10/1987 | Bersin |
| 4,820,377 A | 4/1989 | Davis et al. |
| 4,904,621 A | 2/1990 | Loewenstein et al. |
| 4,913,929 A | 4/1990 | Moslehi et al. |
| 5,030,319 A | 7/1991 | Nishino et al. |
| 5,138,973 A | 8/1992 | Davis et al. |
| 5,198,634 A | 3/1993 | Mattson et al. |
| 5,228,206 A | 7/1993 | Grant et al. |
| 5,248,636 A | 9/1993 | Davis et al. |
| 5,338,393 A | 8/1994 | Burmer |
| 5,403,434 A | 4/1995 | Moslehi |
| 5,620,559 A | 4/1997 | Kikuchi |
| 5,686,748 A | 11/1997 | Thakur et al. |
| 5,698,039 A | 12/1997 | Patz et al. |
| 5,923,966 A | 7/1999 | Teramoto et al. |
| 5,939,831 A | 8/1999 | Fong et al. |
| 5,992,429 A | 11/1999 | Peckman |
| 6,008,128 A | 12/1999 | Habuka et al. |
| 6,063,300 A | 5/2000 | Suzuki et al. |
| 6,071,823 A | 6/2000 | Hung et al. |
| 6,077,353 A | 6/2000 | Al-Sharif et al. |
| 6,079,426 A | 6/2000 | Subrahmanyam et al. |
| 6,107,192 A | 8/2000 | Subrahmanyan et al. |
| 6,110,836 A | 8/2000 | Cohen et al. |
| 6,153,529 A | 11/2000 | Agarwal |
| 6,165,273 A | 12/2000 | Fayfield et al. |
| 6,197,694 B1 | 3/2001 | Beinglass |
| 6,313,042 B1 | 11/2001 | Cohen et al. |
| 6,319,861 B1 | 11/2001 | Shih et al. |
| 6,329,297 B1 | 12/2001 | Balish et al. |
| 6,339,028 B2 | 1/2002 | Tesauro |
| 6,346,489 B1 | 2/2002 | Cohen et al. |
| 6,347,636 B1 | 2/2002 | Xia et al. |
| 6,372,657 B1 | 4/2002 | Hineman et al. |
| 6,374,831 B1 | 4/2002 | Chandran et al. |
| 6,395,192 B1 | 5/2002 | Nemirovsky et al. |
| 6,457,478 B1 | 10/2002 | Danese |
| 6,498,107 B1 | 12/2002 | Fenner |
| 6,534,412 B1 | 3/2003 | Lin |
| 6,537,876 B2 | 3/2003 | Chung et al. |
| 6,706,334 B1 | 3/2004 | Kobayashi et al. |
| 6,767,834 B2 | 7/2004 | Chung et al. |
| 6,776,874 B2 | 8/2004 | Kobayashi et al. |
| 7,235,492 B2 | 6/2007 | Samoilov |
| 7,396,480 B2 | 7/2008 | Kao et al. |
| 7,416,989 B1 | 8/2008 | Liu et al. |
| 7,494,545 B2 | 2/2009 | Lam et al. |
| 7,604,708 B2 | 10/2009 | Wood et al. |
| 7,651,948 B2 | 1/2010 | Kim et al. |
| 7,704,887 B2 | 4/2010 | Fu et al. |
| 7,767,024 B2 | 8/2010 | Kao et al. |
| 7,780,793 B2 | 8/2010 | Yang et al. |
| 8,043,972 B1 | 10/2011 | Liu et al. |
| 8,187,486 B1 | 5/2012 | Liu et al. |
| 8,445,352 B2 | 5/2013 | Yokoyama et al. |
| 8,445,389 B2 | 5/2013 | Zojaji et al. |
| 8,551,880 B2 | 10/2013 | Mebarki et al. |
| 8,772,162 B2 | 7/2014 | Zheng et al. |
| 8,951,913 B2 | 2/2015 | Zheng et al. |
| 8,956,980 B1 | 2/2015 | Chen et al. |
| 2001/0032704 A1 | 10/2001 | Tesauro |
| 2002/0045355 A1 | 4/2002 | Chong et al. |
| 2002/0106908 A1 | 8/2002 | Cohen et al. |
| 2002/0108930 A1 | 8/2002 | Nemirovsky et al. |
| 2002/0124867 A1 | 9/2002 | Kim et al. |
| 2002/0151156 A1 | 10/2002 | Hallock et al. |
| 2003/0060030 A1 | 3/2003 | Lee et al. |
| 2006/0024970 A1* | 2/2006 | Smith ............... H01L 21/02046 438/706 |
| 2006/0196527 A1 | 9/2006 | Nishimura et al. |
| 2010/0041212 A1 | 2/2010 | Jinzu et al. |
| 2013/0309875 A1* | 11/2013 | Huang ............. H01L 21/02052 438/752 |
| 2014/0011339 A1* | 1/2014 | Zheng ................ H01L 21/3065 438/466 |
| 2014/0252565 A1* | 9/2014 | Greer ............... H01L 21/31122 257/635 |
| 2014/0273493 A1* | 9/2014 | Limdulpaiboon .... H01L 29/778 438/723 |

OTHER PUBLICATIONS

European Search Report dated Nov. 16, 2015 received in corresponding EP App. No. 15158948, filed Mar. 13, 2015, in 7 pages.

Nishino, H., Hayasaka, N., and Okano, H., "Damagefree selective etching of Si native oxides using NH3/NF3 and SF6/H2O downflow etching," Journal of Applied Physics, Jun. 1993, vol. 74, Issue 2, p. 1345.

* cited by examiner

GERMANIUM OXIDE PRE-CLEAN MODULE AND PROCESS

BACKGROUND

1. Field

The present invention relates to the fabrication of integrated circuits, particularly to methods and apparatuses for pre-cleaning a substrate surface.

2. Description of the Related Art

Fabrication of integrated circuits often can involve formation of one or more material layers on a substrate surface. These material layers can include, for example, mono-crystalline, polycrystalline, and/or amorphous material layers. Formation of the material layers can be achieved using various thin film deposition techniques, including various physical (e.g., physical sputtering) and/or chemical (e.g., chemical vapor deposition, atomic layer deposition, and/or epitaxial deposition) deposition techniques. For example, mono-crystalline material formation on a substrate surface can be performed using an epitaxial deposition process, such as for formation of mono-crystalline semiconductor materials (e.g., mono-crystalline silicon).

The presence of an intervening material (e.g., a native oxide layer, such as an oxide material layer comprising silicon and germanium on a silicon-germanium substrate) on the substrate surface may interfere with formation of a desired material layer over that substrate surface. For example, the intervening material may cause introduction of an increased number of defects in the structure of the desired material layer and/or may adversely affect an electrical performance of the desired material layer. In some embodiments, an intervening material such as a native oxide material may form on a substrate surface due to exposure of the substrate to oxygen during the integrated circuit fabrication process (e.g., exposure to ambient air during transfer of the substrate between fabrication systems, and/or to residual oxidizing agents within fabrication systems).

Accordingly, there is a continuing need for processes for forming high quality layers on a substrate surface.

SUMMARY

A method for integrated circuit fabrication can include removing oxide material from a surface of a substrate, where the surface includes silicon and germanium. Removing the oxide material can include depositing a halogen-containing pre-clean material on the surface, and sublimating a portion of the halogen-containing pre-clean material to expose the silicon on the surface. A passivation material can be deposited on the exposed silicon. The passivation material comprises chlorine in some embodiments.

A method for integrated circuit fabrication can include removing an oxide material from a surface of a substrate, where the substrate includes silicon and germanium. Removing the oxide material can include depositing a chlorine-containing passivation material on the surface of the substrate, and sublimating the chlorine-containing passivation material substantially without etching the substrate.

A method for integrated circuit fabrication can include removing a germanium-containing oxide material from a surface of a substrate, where the substrate includes germanium. Removing the germanium-containing oxide material can include forming a halogen and germanium-containing pre-clean material from the germanium-containing oxide material and sublimating the halogen and germanium-containing pre-clean material.

BRIEF DESCRIPTION OF THE DRAWINGS

Various features, aspects, and advantages of the present disclosure are described with reference to the drawings of certain embodiments, which are intended to illustrate certain embodiments and not to limit the invention.

DETAILED DESCRIPTION

Figure 1:
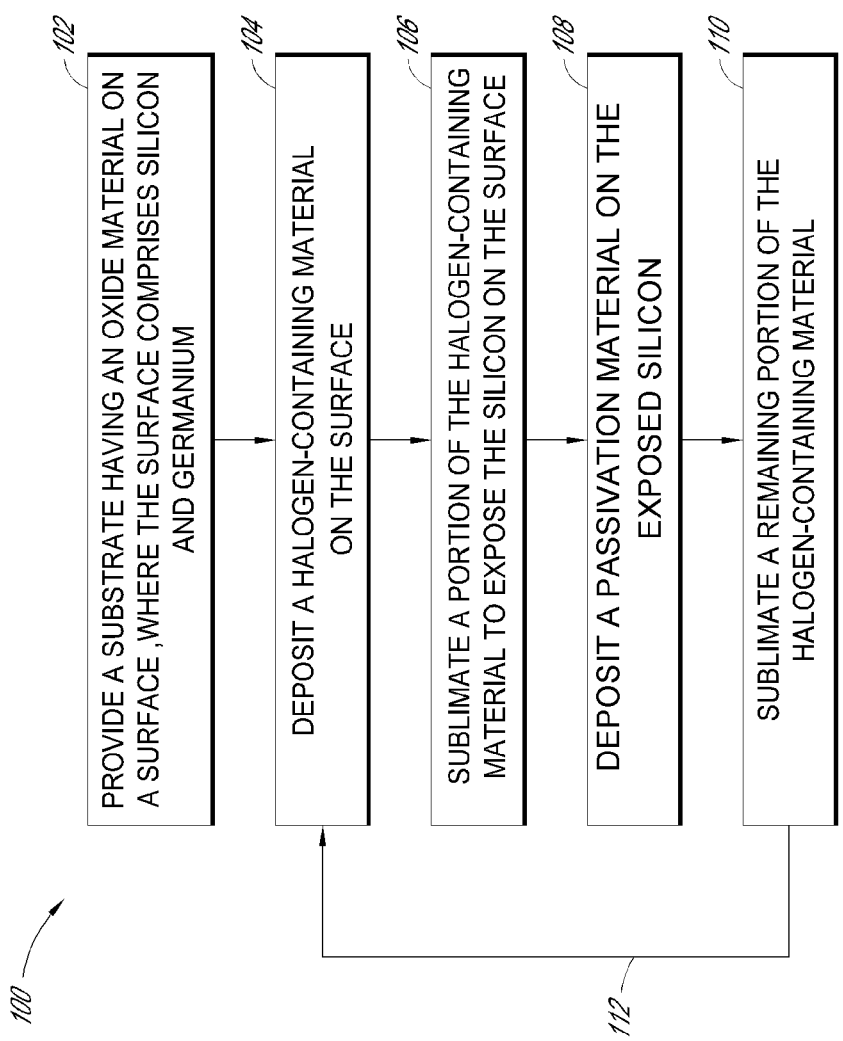
FIG. 1 shows an example of a substrate surface pre-clean process.

Various embodiments are described herein in relation to a pre-cleaning process for removing oxide material from an exposed surface of a substrate. It will be understood that the resulting pre-cleaned surface can provide a surface that facilitates the later formation of high quality layers of materials, such as the epitaxial growth of silicon.

In some embodiments, a substrate pre-clean process is configured to remove an oxide material from the surface of a substrate comprising germanium, including substrate surfaces comprising germanium or both silicon and germanium. In some embodiments, the substrate surface can comprise both silicon and germanium at any molar ratio (e.g., $Si_{1-x}Ge_x$, where x greater than 0 and less than 1). For example, the process may remove a native oxide material from a silicon-germanium substrate. The pre-clean process can include depositing a pre-clean material on the substrate surface and subsequently volatizing the pre-clean material, thereby removing the oxide material from the substrate surface. Removing the pre-clean material can include removing part or all of the pre-clean material from the substrate. Without being limited by any particular theory or mode of operation, it is believed that, to form the pre-clean material, reactant species flowed into the reaction chamber during the pre-clean process may chemically interact with the oxide material on the substrate surface. In some embodiments, the pre-clean material may comprise one or more components generated from chemical reactions between the reactant species and a substrate surface oxide material and/or chemical reactions between the reactant species themselves. For example, a reactant gas for forming a pre-clean material may comprise a halogen such that the halogen-containing reactant gas chemically reacts with the substrate surface oxide (e.g., silicon oxide and germanium oxide) to form pre-clean material with some portions comprising halogen and silicon, and other portions comprising halogen and germanium. The formation and subsequent removal of the pre-clean material causes the removal of surface oxide, thereby leaving a high quality oxide-free surface on at least some portions of the substrate.

In some embodiments, different portions of the pre-clean material may be removed at different times. For example, without being limited by any particular theory or mode of operation, the pre-clean material may comprise components which volatize at different temperatures, resulting in a first portion of the pre-clean material being sublimated from the substrate surface prior to the sublimation of a second different portion. For example, the portion of the pre-clean material comprising halogen and silicon may have a lower sublimation temperature than the portion of the pre-clean material comprising halogen and germanium, resulting in volatizing of the halogen and silicon-containing portion prior to volatizing of the halogen and germanium-containing portion as the temperature of the substrate is increased.

Again, without being limited by any particular theory or mode of operation, sublimation of the halogen and silicon-containing portion may leave silicon on the substrate surface exposed. It is believed that a subsequent sublimation of the halogen and germanium-containing portion may cause contamination and/or re-oxidation of the exposed silicon. In some embodiments, a passivation film, e.g., a chlorine-containing passivation film, can be formed on the exposed silicon, so that, during sublimation of the halogen and germanium-containing pre-clean material, the passivation film provides a protective barrier for the silicon. Advantageously, this may provide a silicon surface that is not or is substantially not contaminated and/or re-oxidized after the sublimation of the halogen and germanium-containing pre-clean material.

The passivation film, e.g., the chlorine-containing passivation film, may be formed by exposing the substrate to a passivation film reactant gas, e.g., a chlorine-containing gas. For example, chlorine-containing gas may be flowed into the reaction chamber during the pre-clean process to form the chlorine-containing passivation film. In some embodiments, the passivation film may be formed by exposing the substrate to a passivation film reactant gas comprising one or more halogens other than chlorine (e.g., fluorine, bromine, and/or iodine), such as to form a fluorine, bromine and/or iodine-containing passivation film. In some embodiments, the passivation film may be formed by exposing the substrate to a passivation film reactant gas comprising a chlorine-containing component and one or more components comprising a halogen other than chlorine.

In some embodiments, the passivation film is formed before sublimation of the halogen and germanium-containing portion. For example, the substrate may be exposed to precursor for the passivation film before that sublimation. In some embodiments, the flow of passivation film precursor may continue from the sublimation of the lower sublimation temperature portion until the completion of the sublimation of the higher sublimation temperature portion. It will be appreciated that the temperature of the substrate may be ramped up between sublimation of the silicon-containing pre-clean material and sublimation of the germanium-containing pre-clean material. In some embodiments, the passivation film is formed before the substrate temperature reaches the sublimation temperature of the germanium-containing pre-clean material. The passivation film and the germanium-containing pre-clean material may be subsequently removed to provide a pre-cleaned substrate surface. In some embodiments, the passivation film can be removed during a process for sublimating the germanium-containing pre-clean material. For example, the substrate may be heated to a temperature for sublimating the germanium-containing pre-clean material, where such heating removes the germanium-containing pre-clean material and the passivation film.

In some embodiments, a target material can be deposited on the pre-cleaned substrate surface, including for example a conductive material. The conductive material can include, without limitation, a semiconductor-containing material (e.g., a silicon-containing material), a metal-containing material, or combinations thereof. For example, the target material may comprise mono-crystalline silicon. As used herein, a target material is a material deposited directly in contact with the pre-cleaned substrate surface. In some embodiments, the substrate, from which the oxide material is removed, may be patterned (e.g., have a pattern of recesses such as trenches on its surface). In some embodiments, the substrate may include exposed electronic devices (e.g., transistor structures).

In some embodiments, the pre-clean process can include a plurality of cycles, where each cycle can include forming a pre-clean material, removing a first portion of the pre-clean material, forming the passivation film, and removing a second portion of the pre-clean material. A pre-clean process including more than one cycle may advantageously demonstrate exceptionally high selectivity. For example, as compared to selectivity performance of a single cycle of the pre-clean process, a second cycle and/or other subsequent additional cycles of the pre-clean process can demonstrate significantly higher selective removal of oxide from the substrate surface relative to removal of another material, such as silicon nitride, from the substrate surface. In some embodiments, a pre-clean process including a plurality of cycles may facilitate desired removal of a surface oxide material while maintaining a desirably low number of defects, including undesired clogging and/or over-etching of one or more features on the substrate surface.

In some embodiments, the pre-clean process can be performed in situ in a single reaction chamber. For example, depositing the pre-clean material, volatizing the pre-clean material, depositing the passivation film, and removing the passivation film may be performed in the same reaction chamber. Advantageously, performing the pre-clean process in a single reaction chamber may facilitate increased throughput and reduce contamination due to the transport of the substrate.

In some other embodiments, the pre-clean material can be formed in a reaction chamber different from that in which the pre-clean material is subsequently removed from the substrate. For example, the pre-clean material can be formed in a first reaction chamber and subsequently transferred to a second reaction chamber where the pre-clean material is removed, thereby providing a pre-cleaned substrate surface. In some embodiments, the passivation film is formed in the second reaction chamber. For example, sublimation of the pre-clean material may be performed in the second reaction chamber. In some embodiments, the pre-clean material may be partially removed in the first reaction chamber. For example, a first portion of the pre-clean material may be removed in the first reaction chamber, and a passivation film may be formed on the substrate surface in the first reaction chamber. In some embodiments, the second reaction chamber may be a chamber in which the target material can be formed on the pre-cleaned substrate surface. In some embodiments, the second reaction chamber can be an epitaxial deposition chamber and the target material can be an epitaxial silicon layer (e.g., mono-crystalline silicon).

Removal of the pre-clean material in the same reaction chamber in which a target material is subsequently formed on the substrate may advantageously provide a high quality surface for the later deposition of the target material. For example, the pre-clean material may provide a protective layer over the substrate surface, reducing and/or preventing additional oxidation from occurring on the substrate surface during transport of the substrate to the reaction chamber for the target material deposition. In some embodiments, removal of the pre-clean material in the same reaction chamber in which the target material is subsequently formed may facilitate deposition of a target material having a reduced defect count and/or improved electrical performance. In some embodiments, removal of the pre-clean material in the same reaction chamber in which the target material is subsequently formed may facilitate transport of the substrate outside of a vacuum environment subsequent to the pre-clean process, and/or use of reaction chambers not vacuum coupled to one another (e.g., use of reaction chambers not coupled to one another through various gating valves, such as reaction chambers in a cluster tool).

Referring to FIG. 1 an example process 100 for pre-cleaning a substrate surface is shown. In block 102, a substrate having an oxide material on a substrate surface is provided, where the surface can include silicon and germanium. In some embodiments, the oxide material includes silicon oxide and germanium oxide. In block 104, pre-clean material, such as a material containing a halogen, can be formed on the substrate surface. In some embodiments, the halogen-containing pre-clean material can be formed by exposing the oxide material to a pre-clean material reactant gas. It will be appreciated that the composition of the halogen-containing pre-clean material may vary in different areas of the substrate. For example, the halogen-containing pre-clean material may comprise a portion comprising halogen and silicon, in areas that previously contained silicon oxide, and a portion comprising halogen and germanium, in areas that previously contained germanium oxide. In block 106, a portion of the halogen-containing pre-clean material can be sublimated to expose the silicon on the surface of the substrate. In some embodiments, the halogen and silicon-containing material has a lower sublimation temperature than the halogen and germanium-containing material. As a result, sublimating the portion of the pre-clean material at block 106 may comprise sublimating halogen and silicon-containing material to remove silicon and oxygen-containing species from the surface, thereby exposing silicon on the substrate surface. In block 108, a passivation material can be formed on the exposed silicon. For example, a chlorine-containing passivation film can form a protective barrier over the exposed silicon. In block 110, a remaining portion of the halogen-containing pre-clean material can be sublimated. The halogen and germanium-containing pre-clean material may have a higher sublimation temperature than the halogen and silicon-containing pre-clean material, and sublimating the remaining portion of the halogen-containing pre-clean material can remove the halogen and germanium-containing pre-clean material from the surface. In some embodiments, the passivation film can be removed from the substrate during sublimation of the remaining portion of the halogen-containing pre-clean material. For example, the passivation film may be removed during heating the substrate for sublimating the remaining portion of the pre-clean material.

In some embodiments, a reaction chamber pressure can be about 1 millitorr to about 50 torr during the pre-clean process 100. In some embodiments, the reaction chamber pressure can be about 1 millitorr to about 30 torr, including about 1 millitorr to about 20 torr. Preferably, the chamber pressure is about 1 millitorr to about 5 Torr, and more preferably from about 1 millitorr to about 1 Torr.

In some embodiments, the substrate surface may comprise a silicon nitride material (e.g., a silicon nitride material used in formation of various electronic devices on the substrate surface, including spacer features for the electronic devices) and an oxide material (e.g., oxide material comprising silicon and germanium) which is to be removed by the pre-clean process. In some embodiments, the oxide material can be selectively removed relative to the silicon nitride material on the substrate surface at a selectivity of greater than about 7:1. In some embodiments, the selectivity of a pre-clean process for removing the oxide relative to silicon nitride can be about 6:1 to about 150:1. For example, the selectivity can be about 6:1 to about 60:1, or about 7:1 to about 20:1, including about 7:1 to about 15:1, or about 8:1 to about 15:1, or about 8:1 to about 12:1.

As shown in FIG. 1, the pre-clean process 100 may include a plurality of cycles 112112. A cycle 112112 of the pre-clean process may include blocks 104, 106, 108, and 110. For example, the pre-clean process 100 may include a repetition of blocks 104, 106, 108, and 110 for a desired number of times to achieve desired oxide removal from the substrate surface. In some embodiments, each cycle 112112 removes only a portion of the oxide material, with the plurality of cycles configured to remove a desired amount (e.g., substantially all) of the oxide material.

With continued reference to FIG. 1, depositing the pre-clean material, such as a halogen-containing pre-clean material, on the substrate surface (e.g., block 104 of FIG. 1) can comprise exposing the substrate surface to the pre-clean material reactant gas. The composition of the pre-clean material reactant gas can include one or more carrier gases. A suitable carrier gas can include any number of inert gases. In some embodiments, the carrier gas can comprise argon (Ar). In some embodiments, the pre-clean material reactant gas can also include a halogen-containing gas. For example, the halogen-containing gas can be a fluorine-containing gas. Suitable fluorine-containing gases can include without limitation, nitrogen trifluoride ($NF_3$), hydrogen fluoride (HF), and/or diatomic fluorine ($F_2$). In some embodiments, the pre-clean material reactant gas can also include a hydrogen-containing gas. A suitable hydrogen-containing gas can include, for example, ammonia ($NH_3$).

As described herein, without being limited by any particular theory or mode of operation, the pre-clean material can comprise one or more components formed by reaction of the pre-clean material reactant gas and a substrate surface oxide material, including an oxide material comprising silicon and germanium. For example, a pre-clean material reactant gas comprising ammonia, and one or more fluorine-containing compounds is believed to chemically react with the oxide to generate water vapor, and a pre-clean material comprising nitrogen, hydrogen, germanium and silicon. In some embodiments, ammonia and nitrogen trifluoride, hydrogen fluoride, and/or fluorine can react with the oxide to provide a pre-clean material comprising ammonium hexafluorosilicate (($NH_4$)$_2$$SiF_6$) and ammonium hexafluorogermanate (($NH_4$)$_2$$GeF_6$).

Without being limited by any particular theory or mode of operation, it is believed that ammonium fluoride ($NH_4F$) may be formed when a fluorine (F) atom from a halogen-containing constituent of the reactant gas (e.g., $NF_3$, HF, and/or $F_2$) reacts with ammonia ($NH_3$) to form hydrogen fluoride (HF), which can combine with ammonia ($NH_3$) to form ammonium fluoride ($NH_4F$). In some embodiments, ammonium fluoride can remove the oxide material by decomposing and reacting with the oxide to form silicon tetrafluoride ($SiF_4$), germanium tetrafluoride ($GeF_4$), and water vapor ($H_2O$), and the silicon tetrafluoride ($SiF_4$) and germanium tetrafluoride ($GeF_4$) can combine with $NH_4F$ to form ammonium hexafluorosilicate (($NH_4$)$_2$$SiF_6$) and ammonium hexafluorogermanate (($NH_4$)$_2$$GeF_6$), the ammonium hexafluorosilicate (($NH_4$)$_2$$SiF_6$) and ammonium hexafluorogermanate (($NH_4$)$_2$$GeF_6$) forming a film layer on the substrate surface. For example, the electronegative fluorine (F) of ammonium fluoride can be attracted to the relatively more electropositive silicon (Si) and germanium (Ge) of the oxide material, while ammonium ($NH_4^+$) can be attracted to oxygen (O) of the oxide material.

In some embodiments, the substrate can be maintained at a desired temperature during formation of the pre-clean material, including for example while the substrate surface is exposed to a pre-clean material reactant gas of the pre-clean process. In some embodiments, the substrate may be maintained at a temperature above a condensation temperature of the pre-clean material reactant gas during formation of the pre-clean material. For example, the substrate can be maintained at a temperature of greater than about 15° C., or greater than about 20° C. in some embodiments. In some embodiments, the substrate can be maintained at a temperature of about 15° C. to about 50° C., including about 15° C. to about 30° C., about 22° C. to about 28° C., and about 25° C. to about 30° C. For example, the substrate can be maintained at a temperature of about 18° C. to about 28° C., which can facilitate a high selectivity for the removal of the oxide relative to silicon nitride material on substrate surface.

One or more constituents of the pre-clean material reactant gas may be activated by a plasma source. For example, one or more constituents of the reactant gas may be activated by a remote plasma source (e.g., a remote plasma unit, or RPU), such as by flowing the one or more constituents through the remote plasma generator to generate one or more activated reactant species (e.g., generate charged ions, and/or neutral atoms and/or radicals) before flowing those species into the reaction chamber. In some embodiments, at least one of the constituents of the pre-clean material reactant gas is not activated by a plasma generator.

In some embodiments, the substrate surface pre-clean process 100 can include a carrier gas (e.g., argon), halogen-containing gas, and/or hydrogen-containing gas (e.g., to provide reactant species comprising argon-containing, halogen-containing, and/or hydrogen-containing charged ions, atoms, and/or radicals), at least one of which is plasma-activated. For example, a reactant gas comprising argon (Ar) may be activated by a remote plasma source, such as by flowing the argon gas through a remote plasma unit. In some embodiments, a fluorine-containing gas can be activated by being flowed through the remote plasma unit prior to being introduced into a reaction chamber. In some embodiments, the hydrogen-containing gas (e.g., ammonia) can be activated by flowing the hydrogen-containing gas through a remote plasma generator, also referred to as a remote plasma source herein.

In some embodiments, one or more of the carrier gas, halogen-containing gas, and hydrogen-containing gas may not be plasma-activated. For example, unactivated reactant gas may not flow through a remote plasma source before the substrate surface is exposed to it in the reaction chamber. In some embodiments, the carrier gas can be activated by a remote plasma generator source while the halogen-containing gas and the hydrogen-containing gas may not be activated by a remote plasma generator source. For example, a fluorine containing gas and a hydrogen containing gas can be introduced into the reaction chamber without flowing the gases through a plasma source. In some embodiments, all constituents of the pre-clean material reactant gases are activated by a remote plasma source, including for example the carrier gas, the halogen-containing gas, and the hydrogen-containing gas.

In some embodiments, unactivated pre-clean material reactant gas can be combined with one or more pre-clean material reactant gases activated by a plasma source before being introduced into the reaction chamber. For example, unactivated reactant gas can be combined with reactant gas activated by a remote plasma source downstream of the remote plasma source prior to being introduced into the reaction chamber. In some embodiments, constituents of a reactant gas can be sequentially introduced into the reaction chamber. For example, the substrate may be first exposed to one or more activated constituents of the reactant gas, followed by one or more unactivated constituents of the reactant gas, or vice versa. In some embodiments, activated constituents and/or unactivated constituents of the reactant gas may themselves be sequentially introduced into the reaction chamber (e.g., a first activated constituent of the reactant gas, followed by a second activated constituent of the reactant gas).

In some embodiments, a carrier gas (e.g., argon) activated by a remote plasma source can be combined with an unactivated halogen-containing gas (e.g., hydrogen fluoride, diatomic fluorine, and/or nitrogen trifluoride) and unactivated hydrogen-containing gas (e.g., ammonia) at a location downstream of the remote plasma source, before the activated carrier gas and unactivated halogen-containing gas and unactivated hydrogen-containing gas are introduced into a reaction chamber. In some embodiments, a carrier gas (e.g., argon) and a halogen-containing gas (e.g., hydrogen fluoride, diatomic fluorine, and/or nitrogen trifluoride) are combined and activated by a remote plasma source, then combined with an unactivated hydrogen-containing gas (e.g., ammonia) at a location downstream of the remote plasma source before the activated carrier gas, the activated halogen-containing gas, and the unactivated hydrogen-containing gas are introduced into a reaction chamber. In some embodiments, a carrier gas (e.g., argon), a halogen-containing gas (e.g., hydrogen fluoride, diatomic fluorine, and/or nitrogen trifluoride) and a hydrogen-containing gas (e.g., ammonia), are all activated by a remote plasma source. For example, the carrier gas, the halogen-containing gas and the hydrogen-containing gas may be combined prior to flowing the gases through the remote plasma source.

In some embodiments, formation of a pre-clean material can include first introducing into a reaction chamber a combination of a carrier gas (e.g., argon) and a halogen-containing gas (e.g., hydrogen fluoride, diatomic fluorine, and/or nitrogen trifluoride) activated by a remote plasma source, followed by a combination of unactivated halogen-containing gas (e.g., hydrogen fluoride) and hydrogen-containing gas (e.g., ammonia). In some embodiments, formation of a pre-clean material can include first introducing into a reaction chamber a combination of a carrier gas and a halogen-containing gas activated by a remote plasma source, then sequential flow of unactivated halogen-containing gas followed by unactivated hydrogen-containing gas.

In some embodiments, one or more processes can be used for gas removal from the reaction chamber (e.g., removal of an existing reaction chamber atmosphere, which may include excess reactant gas and/or gaseous reaction byproducts). In some embodiments, one or more gas removal processes can be used between flows of constituents of the reactant gas into the reaction chamber. For example, the reaction chamber may be evacuated and/or purged. Various inert gases may be used in the purge process, including for example nitrogen ($N_2$), helium (He), and/or argon (Ar). In some embodiments, unactivated inert gas can be used in the purge process (e.g., unactivated $N_2$, He, and/or Ar).

A sequence of gas flow in a pre-clean process can include, for example, first introducing into the reaction chamber a combination of a carrier gas (e.g., argon) and a halogen-containing gas (e.g., hydrogen fluoride, diatomic fluorine, and/or nitrogen trifluoride) activated by a remote plasma source, followed by a gas removal process, and then followed by flow into the reaction chamber of a combination of unactivated halogen-containing gas (e.g., hydrogen fluoride) and hydrogen-containing gas (e.g., ammonia).

In some embodiments, a gas removal process can be used prior to starting the flow of reactant gas and/or subsequent to stopping the flow of reactant gas into the reaction chamber. In some embodiments, one or more purge processes can be performed prior to starting flow of reactant gas into the reaction chamber and/or subsequent to stopping flow of reactant gas into the reaction chamber. For example, one or more inert gases (e.g., argon, including unactivated argon) can be flowed into the reaction chamber prior to starting flow of reactant gas and, in some embodiments, subsequent to stopping the flow of the reactant gas into the reaction chamber. An example of a sequence of gas flow can include, for example, performing a first reaction chamber purge process including flowing into the reaction chamber one or more inert gases, then introducing constituents of the reactant gas into the reaction chamber. After stopping the flow of constituents of the reactant gas, a second purge process can be performed, where the second purge process includes flowing into the reaction chamber one or more inert gases for purging the reaction chamber of excess constituents of the reactant gas and/or gaseous reaction byproducts.

In some embodiments, one or more inert gases of a purge process can be flowed through the remote plasma unit prior to being introduced into the reaction chamber. The one or more inert gases of the purge process may not be plasma activated within the remote plasma unit (e.g., flow of the one or more inert gases through the remote plasma unit may occur while the plasma is not ignited within the remote plasma unit). For example, the one or more inert gases may be used to purge the remote plasma unit and/or for subsequently igniting the plasma in the remote plasma unit. For example, after flowing an inert gas through the remote plasma unit for a desired duration of time while the plasma is not ignited, flow of the inert gas through the remote plasma unit may be continued such that plasma within the remote plasma unit can be ignited with that inert gas flowing through the remote plasma unit.

In some embodiments, one or more constituents of the pre-clean material reactant gas can be maintained at a desired temperature when introduced into the reaction chamber. For example, one or more of the carrier gas, the halogen-containing gas, and the hydrogen-containing gas may be heated prior to being introduced into the reaction chamber for forming the pre-clean material. In some embodiments, the hydrogen-containing gas is heated. For example, the hydrogen-containing gas may be heated to a temperature of about 30° C. to about 120° C., including about 80° C. to about 115° C., about 70° C. to about 110° C., about 70° C. to about 105° C., and about 70° C. to about 100° C. Pre-heating may advantageously facilitate improved pre-clean process performance, for example facilitating formation of the pre-clean material. In some embodiments, a substrate surface pre-clean process can include a pre-heated ammonia gas, the ammonia gas being heated to a temperature of about 80° C. to about 115° C. One or more other constituents of the reactant gas may also be pre-heated.

It has been found that the ratio of the various pre-clean material reactant gases in the pre-clean process can impact selectivity in the removal of the silicon oxide material with respect to silicon nitride. In some embodiments, a pre-clean material reactant gas can have a molar ratio of a halogen-containing gas to a hydrogen-containing gas of about 3:1 to about 10:1. In some embodiments, the molar ratio can be about 4:1 to about 10:1, including about 5:1 to about 10:1. For example, the pre-clean material reactant gas can have a molar ratio of ammonia to nitrogen trifluoride, hydrogen fluoride and/or fluorine gas of about 4.5:1. In some embodiments, a molar ratio of ammonia activated by a remote plasma source to unactivated nitrogen trifluoride pre-heated in its transfer tube can be about 3:1. Advantageously, such ratios can provide high levels of selectivity for removing the oxide material relative to silicon nitride.

Referring again to FIG. 1, a portion of the pre-clean material formed on the substrate surface, such as a portion of the halogen-containing pre-clean material, can be sublimated (e.g., block 106 of FIG. 1). For example, a first portion of the pre-clean material may be sublimated to remove a first portion of the oxide material from the substrate surface. Pre-clean material may be removed (e.g., decomposed and/or volatilized) using various techniques. In some embodiments, the pre-clean material can be removed by heating the substrate so as to volatize one or more components of the pre-clean material. In some embodiments, the substrate can be heated by initiating or increasing heating power provided to the substrate so as to ramp up a temperature of the substrate to or above a sublimation temperature of one or more components of the pre-clean material.

As described herein, a pre-clean material formed on a surface oxide material comprising silicon and germanium may comprise different compounds, depending on the materials present on the substrate surface. For example, ammonium hexafluorosilicate (($NH_4$)$_2$$SiF_6$) and ammonium hexafluorogermanate (($NH_4$)$_2$$GeF_6$) may be present. In some embodiments, a pre-clean material comprising ammonium hexafluorosilicate (($NH_4$)$_2$$SiF_6$) and ammonium hexafluorogermanate (($NH_4$)$_2$$GeF_6$) can be decomposed and/or volatilized by heating the substrate, for example decomposing to form silicon tetrafluoride ($SiF_4$), germanium tetrafluoride ($GeF_4$), ammonia ($NH_3$) and/or hydrogen fluoride (HF). Ammonium hexafluorogermanate ($NH_4$)$_2$$GeF_6$ can have a higher sublimation temperature than ammonium hexafluorosilicate ($NH_4$)$_2$$SiF_6$, resulting in the pre-clean material sublimating at two separate times; for example, the substrate may be heated such that the portion of the pre-clean material comprising the ($NH_4$)$_2$$SiF_6$ sublimates prior to the portion of the pre-clean material comprising ($NH_4$)$_2$$GeF_6$. In some embodiments, ($NH_4$)$_2$$SiF_6$ may be volatized at temperatures greater than about 80° C., including about 100° C. to about 150° C., or about 120° C., while ($NH_4$)$_2$$GeF_6$ may be volatized at temperatures of greater than about 300° C., including about 350° C. to about 400° C., or about 380° C. Consequently, at block 106, sublimating the portion of the pre-clean material may comprise sublimating the portion of the pre-clean material comprising ($NH_4$)$_2$$SiF_6$, substantially without sublimating ($NH_4$)$_2$$GeF_6$.

Without being limited by any particular theory or mode of operation, sublimating ($NH_4$)$_2$$SiF_6$ may complete the removal of silicon oxide on the substrate surface, thereby exposing pre-cleaned silicon on the substrate surface. In some embodiments, the exposed silicon may be pure (e.g., crystalline) silicon.

It has been found that the exposed silicon may be contaminated by the remaining halogen and germanium-containing pre-clean material. For example, without being limited by particular theory or mode of operation, the exposed silicon may be contaminated and/or re-oxidized due to remaining $(NH_4)_2GeF_6$ on the substrate surface, for example due to reaction byproducts generated when $(NH_4)_2GeF_6$ is subsequently volatized by heating the substrate to a temperature higher than the sublimation temperature of $(NH_4)_2GeF_6$. For example, one or more components of the byproducts generated by volatizing the portion of the pre-clean material comprising $(NH_4)_2GeF_6$ may redeposit on the exposed silicon, producing undesired surface contaminants and/or re-oxidizing the exposed silicon, thereby undesirably reducing the quality of the substrate surface.

With continued reference to FIG. 1, a passivation material can be formed on the substrate surface (e.g., block 108 of FIG. 1), particularly the portions of the surface with exposed silicon. Preferably, the passivation film directly contacts the exposed silicon. Without being limited by any particular theory or mode of operation, the passivation film may adsorb and/or adhere to the exposed silicon, blocking the exposed silicon from one or more byproducts generated during volatizing of the portion of the halogen and germanium-containing pre-clean material (e.g., $(NH_4)_2GeF_6$). For example, the passivation film may provide a protective barrier for the silicon during sublimation of the portion of the halogen and germanium-containing pre-clean material, so as to avoid or reduce contamination and/or re-oxidation of the silicon by byproducts generated during the sublimation. As discussed herein, the passivation film may be formed of chlorine.

The passivation film can be formed over the silicon by exposing the substrate to a passivation film reactant gas. In some embodiments, a chlorine-containing passivation film can be formed on the substrate surface by supplying chlorine-containing gas (e.g., unactivated chlorine-containing gas) into the reaction chamber during heating of the substrate (e.g., during ramping up of a temperature of the substrate after formation of the halogen-containing pre-clean material).

The passivation film reactant gas may comprise one or more components which can form a desired passivation film over silicon. In some embodiments, the one or more components of the passivation film reactant gas may form a desired protective barrier on the exposed silicon under process conditions present during sublimation of the pre-clean material, without undesirably etching the substrate (e.g., without undesirably etching the exposed silicon on the substrate surface). In some embodiments, the passivation film reactant gas can have desired reactivity toward the exposed silicon such that a passivation film can be formed to protect the exposed silicon, while providing a film which can be subsequently removed from the substrate surface with desired ease without damaging the substrate surface. For example, the formed passivation film can be removed from the substrate surface without having to heat the substrate to a temperature which can adversely affect one or more characteristics of the substrate surface.

In some embodiments, the gas for forming the passivation film can comprise chlorine ($Cl_2$) gas. In some other embodiments, chlorine-containing gas can comprise hydrogen chloride (HCl). In some embodiments, the chlorine-containing reactant gas can comprise dichlorosilane (DCS). In some embodiments, the chlorine-containing gas is a mixture of gases comprising $Cl_2$, HCl and/or DCS. For example, the chlorine-containing gas may comprise a mixture of HCl and DCS. In some embodiments, a flow rate of one or more components of the chlorine-containing gas can be selected such that a desired passivation film can be formed. For example, a chlorine-containing gas comprising a mixture of DSC and HCl can have a flow rate of DCS to HCl at a volumetric ratio of about 1:2 to about 1:5. For example, flow of the chlorine-containing gas into a reaction chamber may comprise about 100 standard cubic centimeter per minute (sccm) of DCS and about 200 sccm of HCl.

In some embodiments, supply of the passivation film reactant gas can begin prior to sublimation of a first portion of the pre-clean material. For example, supply of a chlorine-containing gas to the reaction chamber can begin prior to sublimation of the portion of the halogen and silicon-containing pre-clean material (e.g., $(NH_4)_2SiF_6$) such that a passivation film can form over the exposed silicon surface as the silicon is exposed. For example, flow of the chlorine-containing gas to the reaction chamber can be started prior to the substrate reaching a temperature of greater than about 80° C., including about 100° C. to about 150° C., or about 120° C. In some other embodiments, flow of chlorine-containing gas to the reaction chamber can begin as the substrate reaches, or immediately after the substrate reaches the sublimation temperature of the halogen and silicon-containing pre-clean material. For example, supply of the chlorine-containing gas into the reaction chamber can begin immediately or substantially immediately after the substrate reaches a temperature of about 120° C. Initiating supply of the chlorine-containing gas prior to significant sublimation of the portion of the halogen and silicon-containing pre-clean material may reduce exposure of silicon to any byproducts present within the reaction chamber so as to provide a desired protective barrier over the silicon as it becomes exposed.

In some embodiments, the supply of the passivation film reactant gas, such as the chlorine-containing gas, into the reaction chamber begins after the substrate reaches the sublimation temperature of the portion of the pre-clean material comprising halogen and silicon ($(NH_4)_2SiF_6$), and before reaching the sublimation temperature of the portion of the pre-clean material comprising halogen and germanium (e.g., $(NH_4)_2GeF_6$). Advantageously, such timing for the passivating gas can reduce the duration during which the substrate is exposed to the gas, while providing passivation of the exposed silicon before possible contamination due to sublimation of the halogen and germanium-containing pre-clean material, and while facilitating high throughput since the passivation overlaps with another step (the temperature ramp-up) in the pre-clean process.

In some embodiments, flow of the passivation film reactant gas, such as the chlorine-containing gas, to the reaction chamber can be initiated prior to significant exposure of the exposed silicon to byproducts generated by the sublimation of the halogen and germanium-containing pre-clean material, so as to allow formation of a desired protective barrier over the silicon to avoid or reduce undesired contamination and/or re-oxidation of the silicon. For example, supply of chlorine-containing gas to the reaction chamber may be initiated immediately prior to the portion of the halogen and germanium-containing pre-clean material begins to sublimate (e.g., prior to the heated substrate reaching the sublimation temperature of the portion of the pre-clean material comprising $(NH_4)_2GeF_6$).

In some other embodiments, supply of the passivation film reactant gas to the reaction chamber can be initiated as the substrate reaches, or immediately after, the substrate reaches the sublimation temperature of the portion of the pre-clean material comprising $(NH_4)_2GeF_6$. For example, flow of the chlorine-containing gas to the reaction chamber can be started immediately or substantially immediately prior to, during, or immediately subsequent to the substrate reaching a temperature of about 350° C. to about 400° C., including about 380° C. In some embodiments, supply of the chlorine-containing gas to the reaction chamber can begin immediately prior to the substrate reaching a temperature of about 380° C. Initiating flow of the chlorine-containing gas at such a time may reduce undesired exposure of the substrate to the chlorine-containing gas while facilitating formation of desired passivation film over the exposed silicon.

In some embodiments, flow of the passivation film reactant gas can be continued until the halogen and germanium-containing pre-clean material has been removed from the substrate surface. For example, flow of the chlorine-containing gas into the reaction chamber can continue at least until the substrate is heated to the sublimation temperature of the halogen and germanium-containing pre-clean material.

It will be appreciated that a passivation film reactant gas, such as a chlorine-containing gas, can etch the substrate at some temperatures. For example, flow of the chlorine-containing gas can be stopped prior to the substrate reaching a temperature beyond which the chlorine-containing gas may etch one or more materials on the substrate surface and/or the substrate temperature can be kept below the temperature at which etching occurs. In some embodiments, flow of the chlorine-containing gas can be stopped prior to the substrate reaching a temperature of about 600° C., including about 500° C., or about 475° C., such that the passivation film can form on the substrate without or substantially without etching the substrate. For example, flow of a chlorine-containing gas may be stopped prior to the substrate reaching a temperature of about 450° C. The substrate temperature at which the flow of chlorine-containing gas is stopped to avoid or substantially avoid etching the substrate may be selected based on the composition of the chlorine-containing gas. In some embodiments, flow of a chlorine-containing gas comprising chlorine gas ($Cl_2$) may be stopped prior to the substrate reaching a temperature of about 500° C. In some other embodiments, flow of a chlorine-containing gas comprising dichlorosilane (DCS) and/or hydrogen chloride (HCl) may be stopped prior to the substrate reaching a temperature of about 600° C.

In some embodiments, the substrate is exposed to the passivation film reactant gas during the entire or substantially entire period in which the substrate is heated for sublimating the pre-clean material. For example, the chlorine-containing gas may be supplied into the reaction chamber once heating is started or increased for sublimating the pre-clean material, and is flowed until after all or substantially all of the pre-clean material has been sublimated from the substrate surface, with the substrate temperature preferably remaining below about 500° C. or about 600° C.

Referring again to FIG. 1, a remaining portion of the pre-clean material may be sublimated from the substrate surface (e.g., block 110 of FIG. 1), for example after a desired passivation film (e.g., a chlorine-containing passivation film) has formed on the substrate surface. As discussed herein, the remaining portion of the pre-clean material may comprise $(NH_4)_2GeF_6$. In some embodiments, the temperature of the substrate can be ramped up from its temperature during block 106 to a temperature of about 350° C. to about 400° C., including about 380° C., to sublimate the remaining portion of the pre-clean material comprising the halogen and germanium-containing pre-clean material.

In some embodiments, the substrate can be heated to a temperature higher than the sublimation temperature of the portion of the pre-clean material comprising $(NH_4)_2GeF_6$, such that both the pre-clean material and the passivation film can be removed or substantially removed from the substrate surface to provide a pre-cleaned substrate surface. For example, the passivation film is removed during sublimation of the remaining portion of the pre-clean material. As described herein, the passivation film may comprise a chlorine-containing passivation film. In some embodiments, the substrate can be heated to a temperature beyond which the chlorine-containing passivation film can become an etchant of one or more materials on the substrate surface, for example silicon. In some embodiments, the substrate can be heated to a temperature less than about 500° C., or less than about 600° C., including about 400° C. to about 500° C., including about 425° C. to about 475° C.

Other approaches for providing energy to the pre-clean material to cause removal of that material and/or to the passivation film to cause removal of that film are also contemplated. In some embodiments, the pre-clean material and/or the passivation film can be exposed to gas species activated by a remote plasma source. In some embodiments, the species activated by the remote plasma source can interact with one or more components of the pre-clean material and/or the passivation film to form volatile species which can, for example, be removed from the substrate surface. In some embodiments, the gas species can be an inert gas species (e.g., Ar, $N_2$, He, etc.).

In some embodiments, a pre-clean material and/or the passivation film can be exposed to heated gas (e.g., heated inert gas) to facilitate removal of the pre-clean material and/or the passivation film. The gas can be heated to a temperature sufficient to heat the pre-clean material and/or the passivation film to a temperature that causes at least part of the pre-clean material and/or the passivation film to enter the vapor phase. For example, the temperature may be greater than about 80° C., about 100° C., about 120° C., about 150° C., about 350° C., 380° C., 400° C. or about 450° C.

In some embodiments, a pre-clean material can be exposed to ultra-violet (UV) and/or infrared (IR) radiation to facilitate removal of the pre-clean material. In some embodiments, the passivation film can be exposed to ultra-violet (UV) and/or infrared (IR) radiation to facilitate removal of the film. For example, the UV and/or IR radiation can provide energy that causes at least part of the pre-clean material and/or the passivation film to enter the vapor phase.

In some embodiments, exposing the pre-clean material to gas species activated by a remote plasma source, heated reactant gas, and/or ultra-violet radiation, can reduce the moisture content of the reaction chamber. Advantageously, the reduced moisture content can promote the removal of silicon and/or germanium oxide, since the pre-clean process can generate $H_2O$.

In some embodiments, removal of the pre-clean material can be performed during transfer of the substrate from a first reaction chamber (e.g., a reaction chamber in which the pre-clean material is formed) to a second different reaction chamber (e.g., a reaction chamber in which subsequent processing is performed, such as formation of a target material on the substrate). For example, a pre-clean material may be exposed to ultra-violet radiation and/or infrared radiation while being transferred from the first reaction chamber to the second reaction chamber.

In some embodiments, one or more processes described herein may be applicable to a germanium substrate. For example, a germanium-containing oxide material on a substrate surface comprising germanium can be removed using one or more processes described herein. A halogen and germanium-containing pre-clean material may be formed on the substrate from the germanium-containing oxide material by exposing the germanium-containing oxide material to a halogen-containing reactant gas while the germanium substrate is maintained at a temperature of about 15° C. to about 30° C. The halogen and germanium-containing pre-clean material may be subsequently removed from the substrate surface, thereby removing the germanium-containing oxide material to provide a pre-cleaned substrate surface, by heating the substrate to a temperature of about 320° C. to about 500° C., about 350° C. to about 500° C., including about 350° C. to about 400° C., or about 380° C.

As shown in FIG. 1, the substrate surface pre-clean process 100 can include a plurality of cycles 112. In some embodiments, a pre-clean process 100 comprising a plurality of cycles 112 can facilitate desired removal of a surface oxide material while maintaining a desirably low number of defects. Without being limited by any particular theory or mode of operation, as feature sizes continue to shrink, formation of the pre-clean material on the surface of the substrate may contribute to clogging of the features (e.g., clogging of trench features), thereby hindering subsequent sublimation of the pre-clean material and/or removal of the oxide material from within the clogged features. As feature sizes continue to shrink and aspect ratios increase, the upper surfaces of features may experience over exposure to the pre-clean chemistry during pre-clean processes to achieve desired oxide removal within the features (e.g., at trench bottom portions). Removing the oxide material by performing a pre-clean process comprising a plurality of cycles of depositing and sublimating pre-clean material (e.g., each cycle having a shorter duration) may facilitate desired removal of the oxide material while reducing clogging of substrate surface features and/or reducing over exposure of feature upper surfaces to the pre-clean chemistry (e.g., as compared to a pre-clean process comprising the single longer cycle).

It has been found that the selectivity of a first cycle 112 of a pre-clean process 100 can be significantly different from the selectivity of a subsequent cycle 112 of the pre-clean process 100 (e.g., the selectivity of removal of substrate surface oxide, such as a surface oxide comprising both silicon and germanium, relative to another material on the substrate surface, such as silicon nitride material). In some embodiments, the subsequent cycle 112 of the pre-clean process 100 can advantageously demonstrate significantly higher selectivity compared to the first cycle 112 of the pre-clean process 100. In some embodiments, a second cycle 112 of a pre-clean process 100 can demonstrate selective removal of the substrate surface oxide material relative to a silicon nitride on the substrate surface at a selectivity of about 10:1 to about 150:1, about 30:1 to about 150:1, about 60:1 to about 150:1, about 10:1 to about 100:1, or about 60:1 to about 100:1. A pre-clean process 100 including a larger number of cycles 112 may facilitate even higher selectivity performance.

One or more of the plurality of cycles 112 of the pre-clean process 100 can be performed according to one or more processes described herein. For example, a pre-clean material reactant gas (e.g., concentration of various constituents of the reactant gas, activation and/or pre-heating of one or more constituents of the reactant gas), a passivation film reactant gas (e.g., a chlorine-containing gas, such as a composition of the chlorine-containing gas), and/or one or more process parameters (e.g., a substrate temperature during formation and/or sublimation of a pre-clean material, a duration of exposure of the substrate to the passivation film reactant gas) of a cycle 112 can be selected as described herein. In some embodiments, a pre-clean material reactant gas, passivation film reactant gas, and/or one or more process parameters of a cycle 112 can be the same as or different from that of another cycle 112 in the pre-clean process 100. For example, the pre-clean process 100 may include a plurality of cycles 112 having similar or identical process conditions.

In some embodiments, the pre-clean process can include about 2 to about 20 cycles, including about 2 to about 10 cycles. In some embodiments, the pre-clean process can include about 2 to about 5 cycles. In some other embodiments, the pre-clean process includes a single cycle.

In some embodiments, a number of cycles of the pre-clean process can be selected based on an oxide material removal rate per cycle. In some embodiments, a cycle of a pre-clean process can remove about 3 angstroms (Å) to about 20 Å of the oxide material. In some embodiments, a cycle of the pre-clean process can remove about 3 Å to about 15 Å of the oxide material, or about 3 Å to about 10 Å of the oxide material.

In some embodiments, one or more cycles 112, or a portion of a cycle (e.g., one or more of blocks 104, 106, 108, and 110 of FIG. 1), of a substrate surface pre-clean process 100 can be performed in a first reaction chamber. In some embodiments, one or more other cycles 112, or a portion of a cycle can be performed in one or more different reaction chambers. For example, a substrate may be transferred from a first reaction chamber to a second reaction chamber after performing one or more cycles 112 of the pre-clean process 100 in the first reaction chamber, or after performing a portion of a cycle 112 of the pre-clean process 100 in the first reaction chamber, such that a final removal of a pre-clean material in a final cycle 112 of the pre-clean process 100 is performed in a reaction chamber other than the first reaction chamber. In some embodiments, all cycles 112 of a pre-clean process 100 can be performed in the same reaction chamber.

In some embodiments, formation of a target material (e.g., an epitaxial layer comprising mono-crystalline silicon) on a pre-cleaned substrate surface can be performed in the same reaction chamber in which removal of a final pre-clean material is performed. In some embodiments, a pre-clean material can be deposited on the substrate in a first reaction chamber, followed by transfer of the substrate from the first reaction chamber to a second reaction chamber in which the pre-clean material is removed and a target material is deposited. For example, sublimation of a first portion of the pre-clean material, formation of the passivation film and removal of a second portion of the pre-clean material and the passivation film can be performed in the second reaction chamber. In some embodiments, a temperature at or around which flow of chlorine-containing gas into the second reaction chamber is initiated for forming chlorine-containing passivation film can be selected as described herein. For example, flow of the chlorine-containing gas may begin once the substrate is placed in the second reaction chamber, after heating the substrate in the second reaction chamber to a temperature at or around the sublimation temperature of the halogen and silicon-containing pre-clean material, or after heating the substrate in the second reaction chamber to a temperature between the sublimation temperature of the halogen and silicon-containing pre-clean material and the sublimation temperature of the halogen and germanium-containing pre-clean material. In some embodiments, the flow of the chlorine-containing gas to the second reaction chamber can continue until desired sublimation of the halogen and germanium-containing pre-clean material is complete.

Figure 2:
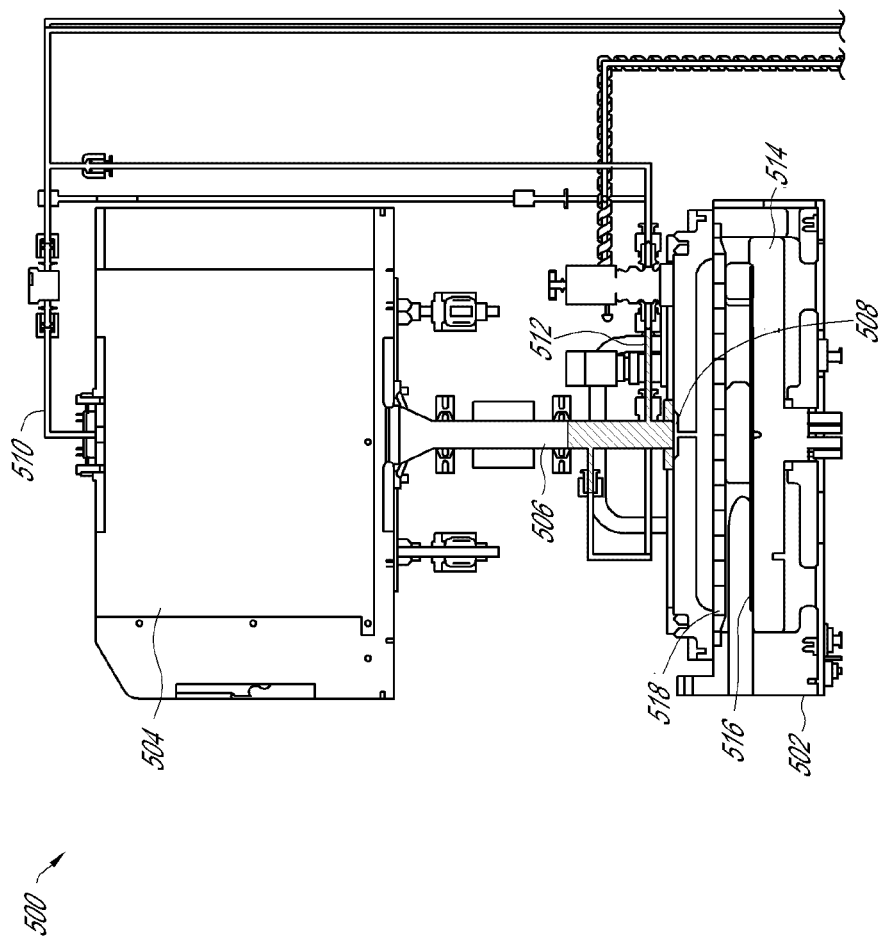
FIG. 2 shows an example of an apparatus configured to perform a substrate surface pre-clean process.

FIG. 2 shows an embodiment of an apparatus 500 which can be used for performing at least a portion of a substrate surface pre-clean process as described herein. The apparatus 500 may be configured for formation and/or removal of a pre-clean material, including formation and/or removal of a pre-clean material to facilitate removal of an oxide material (e.g., an oxide comprising both silicon and germanium) from the substrate surface. The apparatus 500 may include a reaction chamber 502 in fluid communication with a remote plasma unit 504, for example through a transfer tube 506. In some embodiments, the transfer tube 506 can be configured to deliver a pre-clean material reactant gas and/or a passivation film reactant gas (e.g., a chlorine-containing gas) into the reaction chamber 502 (e.g., a pre-clean material reactant gas comprising ammonia gas, fluorine-containing gas, and/or a carrier gas). For example, the transfer tube 506 may introduce pre-clean material reactant gas and/or passivation film reactant gas into the reaction chamber 502 via a reaction chamber gas inlet 508 located at a distal portion of the transfer tube 506. In some embodiments, the remote plasma unit 504 may include a gas inlet 510 configured to allow flow of constituents of the pre-clean material reactant gas through the remote plasma unit 504 such that the constituents of the pre-clean material reactant gas can be activated by the plasma unit 504. In some embodiments, the passivation film reactant gas can be introduced into the reaction chamber 502 other than through the transfer tube 506. For example, the passivation film reactant gas may be introduced into the reaction chamber 502 via a gas inlet different from that through which the pre-clean material reactant gas is introduced into the reaction chamber 502. In some embodiments, the passivation film reactant gas can be introduced into the reaction chamber 502 via an inlet positioned proximate to the showerhead 518 (e.g., above the showerhead 518).

In some embodiments, the transfer tube 506 can include a transfer tube gas inlet 512 configured to allow introduction into the reaction chamber 502 of one or more constituents of the pre-clean material reactant gas which is not activated by the remote plasma unit 504 and the passivation film reactant gas. As shown in FIG. 5, the transfer tube gas inlet 512 may be located proximate to the reaction chamber gas inlet 508. In some embodiments, the transfer tube gas inlet 512 may be positioned at another location on the transfer tube 506. In some embodiments, at least a portion of the transfer tube 506 can be maintained at a desired temperature. For example, a portion of the transfer tube 506 may be heated (e.g., to a temperature of about 80° C. to about 115° C.), including the portion of the transfer tube 506 adjacent to and/or surrounding the portion between the transfer tube gas inlet 512 and the reaction chamber gas inlet 508. For example, at least the portion of the transfer tube 506 between the transfer tube inlet 512 and the reaction chamber gas inlet 508 may be heated to a desired temperature. In some embodiments, the entire length or substantially the entire length of the transfer tube 506 is maintained at a desired temperature (e.g., heated to a temperature of about 30° C. to about 120° C.). A temperature to which the transfer tube 506 is heated can be selected based on a variety of factors. In some embodiments, at least a portion of the transfer tube 506 can be maintained at a desired temperature by using a heater jacket (e.g., covering at least a portion of an exterior surface of the transfer tube 506 with a heater jacket) and/or a material coating (e.g., coating at least a portion of an exterior surface of the transfer tube 506 with the material coating, such as a material coating comprising alumina, including pyrolytic alumina). In some embodiments, a temperature of the transfer tube 506 can be monitored using one or more thermocouples placed at one or more locations along the transfer tube 506. Temperature along a heated portion of the transfer tube 506 may or may not be uniform. In some embodiments, a temperature along the heated portion of the transfer tube 506 can be maintained at one or substantially one desired temperature. In some embodiments, a temperature of one heated portion of the transfer tube 506 may be significantly different from that of another heated portion of the transfer tube 506.

In some embodiments, the reaction chamber 502 can include a susceptor 514 for receiving a substrate 516 (e.g., a wafer). In some embodiments, the reaction chamber 502 can include a showerhead 518 (e.g., a gas distribution plate) positioned downstream of a reactant gas inlet of the reaction chamber 502. The shower head 518 may be configured to facilitate improved uniformity in the distribution of gas species over the substrate 516 positioned in the reaction chamber 502. The substrate 516 may be raised from and/or lowered back onto the susceptor 514 such that the substrate 516 can be positioned at one or more elevated positions (e.g., relative to a position at which the substrate 516 is received by the susceptor 514). For example, the showerhead 512 can be positioned over and opposite the susceptor 514 such that the substrate 516 to can be raised from susceptor 514 to provide a desired separation distance between the substrate 516 and the showerhead 518.

In some embodiments, a carrier gas (e.g., argon), and a fluorine-containing gas (e.g., nitrogen trifluoride), from carrier gas and fluorine-containing gas sources, respectively (not shown), can be introduced into the remote plasma unit 504 via the remote plasma unit gas inlet 510 for activation by the remote plasma unit 504. The carrier gas and the fluorine-containing gas activated by the remote plasma unit 504 can flow through the remote plasma unit 504 and to the reaction chamber 502 through the transfer tube 506. In some embodiments, one or more constituents of the pre-clean material reactant gas not activated by the remote plasma unit 504, including for example, a hydrogen-containing gas such as ammonia from an ammonia source (not shown), can be introduced downstream of the remote plasma unit 504 at a position along the transfer tube 506 via a transfer tube gas inlet 512. In some embodiments, the passivation film reactant gas can be introduced downstream of the remote plasma unit 504 at a position along the transfer tube 506 via a transfer tube gas inlet 512. Portions of the transfer tube proximate to the transfer tube gas inlet 512 and/or the transfer tube gas inlet 512 itself may be heated such that one or more of the unactivated constituents of the pre-clean material reactant gas, such as unactivated ammonia, can be delivered into the reaction chamber 502 at a desired temperature.

In some embodiments, the substrate surface can be exposed to the activated reactant species and the unactivated reactant species of the pre-clean material reactant gas simultaneously or substantially simultaneously, for example combining the activated reactant species and the unactivated reactant species prior to delivery into the reaction chamber, such as prior to delivery through the reaction chamber gas inlet 508. In some embodiments, the substrate surface can be sequentially exposed to the activated reactant species and/or the unactivated reactant species. For example, the substrate surface may be first exposed to activated reactant species (e.g., activated by a remote plasma unit) of one or more constituents of the pre-clean material reactant gas, followed by exposure to a second activated or unactivated reactant species (e.g., unactivated by a remote plasma unit) of another of the one or more constituents of the pre-clean material reactant gas. In some embodiments, the substrate surface can be first exposed to unactivated reactant species followed by exposure to activated reactant species. The sequence of exposure can be selected to provide desired pre-clean process performance. For example, a substrate surface can be first exposed to carrier gas and fluorine-containing gas activated by a remote plasma unit, followed by exposure to a combination of unactivated hydrogen-containing gas (e.g., ammonia) and fluorine-containing gas, or by exposure first to unactivated hydrogen-containing gas and then to unactivated fluorine-containing gas.

The passivation film reactant gas and/or the reactant species of the pre-clean material reactant gas can be distributed over the substrate 516 maintained on the susceptor 514 by flowing the passivation film reactant gas and/or the reactant species through the showerhead 518. In some embodiments, the substrate 516 can be raised from the susceptor 514 to a desired position during at least a portion of the pre-clean process. In some embodiments, the substrate 516 may be at an elevated position during at least a portion of a pre-clean material formation process and/or at least a portion of a pre-clean material removal process (e.g., during a process for sublimating the pre-clean material). In some embodiments, the substrate 516 remains stationary or substantially stationary on the susceptor 514.

The reaction chamber 502 may or may not be part of a multi-chamber processing system, such that a substrate processed by reaction chamber 502 may be transferred to a second reaction chamber without or substantially without being exposed to ambient air. For example, the reaction chamber 502 may be a part of a cluster tool system.

An example sequence of a pre-clean process can include providing into a first reaction chamber (e.g., the reaction chamber 502 described with reference to FIG. 2) a substrate having a surface to be cleaned. The substrate can be maintained at a temperature of about 15° C. to about 30° C. within the first reaction chamber. For example, the substrate can be maintained at a temperature of about 18° C. A first purge process can be performed prior to starting flow of pre-clean material reactant gas into the first reaction chamber. For example, unactivated argon gas can be flowed into the first reaction chamber, after the substrate is provided within the first reaction chamber, and prior to starting flow of pre-clean material reactant gas. The unactivated argon gas may be flowed through the remote plasma unit prior to introducing the unactivated argon gas into the first reaction chamber. For example, the unactivated argon gas may be flowed through the remote plasma unit while no plasma is ignited in the remote plasma unit. Once desired purging of the first reaction chamber is completed, an unactivated hydrogen-containing gas (e.g., unactivated ammonia ($NH_3$)) may be introduced into the first reaction chamber. The unactivated hydrogen-containing gas can be not pre-heated prior to being introduced into the first reaction chamber (e.g., unactivated $NH_3$ introduced into the first reaction chamber can be not pre-heated). Subsequently, plasma within the remote plasma unit can be ignited with the argon gas flowing through that unit and into the first reaction chamber. A halogen-containing gas, such as nitrogen trifluoride ($NF_3$), can subsequently be activated by the remote plasma unit by flowing the halogen-containing gas through the remote plasma unit and into the reaction chamber. After a desired formation of a substrate surface pre-clean material, the flow of pre-clean material reactant gas may be stopped and the plasma in the remote plasma unit may be turned off. A second purge process can be performed after stopping flow of the pre-clean material reactant gas. For example, unactivated argon gas can be flowed into the reaction chamber in the second purge process. The unactivated argon gas may be flowed through the remote plasma unit during the second purge process prior to being introduced into the first reaction chamber.

The substrate may be subsequently transferred to a second reaction chamber such that the pre-clean material may be removed from the substrate within the second reaction chamber. For example, the substrate having the pre-clean formed thereon can be transferred to an epitaxial deposition chamber. As described herein the pre-clean material may be removed through a sublimation process. A chlorine-containing passivation film may be formed on the substrate during sublimation of the pre-clean material, for example over portions of the substrate exposed as the pre-clean material is sublimated. Flow of chlorine-containing gas into the second reaction chamber for forming the passivation film may be initiated when initiating heating power or increasing heating power supplied to the substrate for sublimating the pre-clean material such that the substrate is exposed to the chlorine-containing gas to form the chlorine-containing passivation film during ramping up of the substrate temperature. Heating of the substrate may be performed in preparation for an epitaxial deposition process. For example, exposure of the substrate to the chlorine-containing gas can occur during heating of the substrate to a temperature of about 350° C. to about 600° C., in preparation for a subsequent deposition process, and while sublimating the pre-clean material. In some embodiments, the substrate can be exposed to the chlorine-containing gas while being heated to a temperature of about 400° C. to about 500° C. Flow of chlorine-containing gas to the reaction chamber may be stopped when desired sublimation of the pre-clean material is completed (e.g., after the substrate reaches a temperature of about 350° C. to about 600° C.). As described herein, the chlorine-containing passivation film can be removed during the sublimation process for removing the portion of the pre-clean material comprising the halogen and germanium, such that a pre-cleaned surface is provided after heating the substrate to a temperature of about 350° C. to about 600° C. In some embodiments, a target material comprising an epitaxial material layer can be formed on the pre-cleaned substrate surface in the second reaction chamber.

In some embodiments, a pre-clean process having such a sequence can advantageously facilitate achieving high selectivity (e.g., the selectivity of removal of substrate surface oxide relative to another material on the substrate surface, such as silicon nitride material), including a selectivity of about 14:1. In some embodiments, a pre-clean process having such a sequence can advantageously facilitate achieving improved selectivity as described herein.

Figure 3:
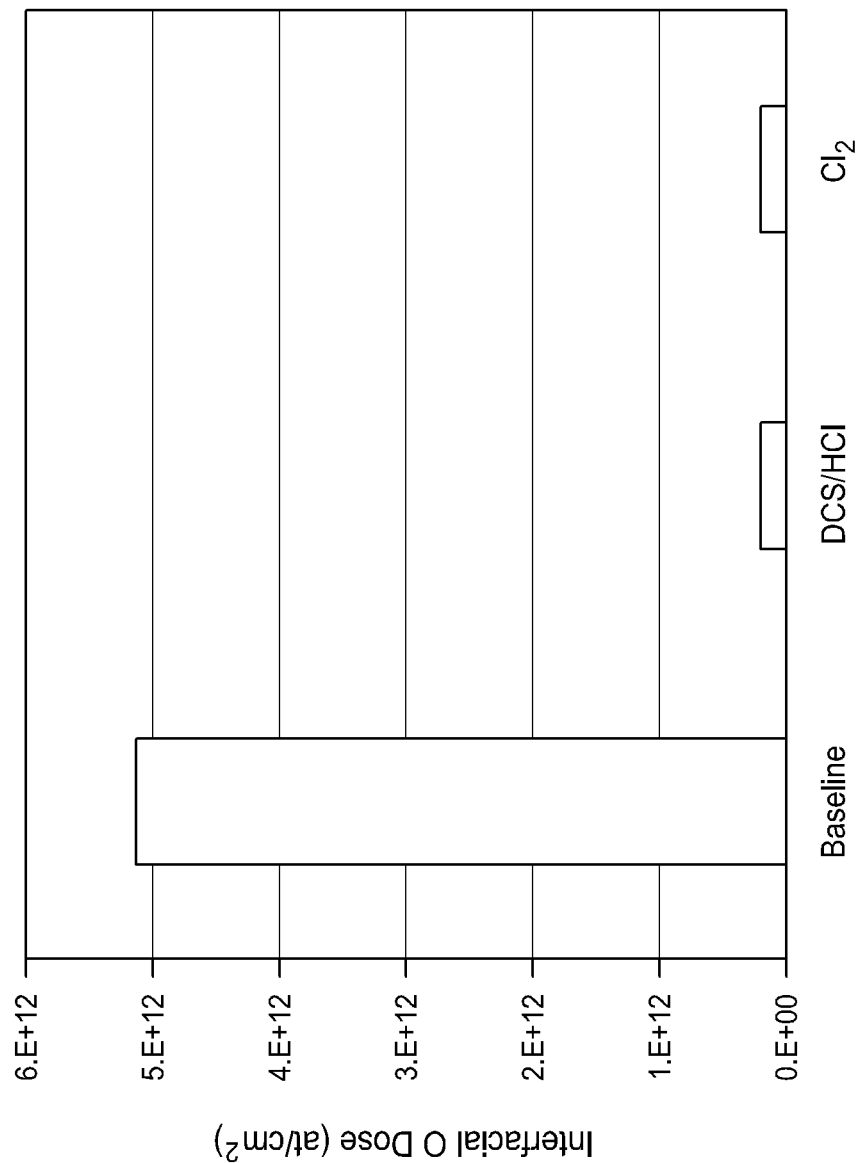
FIG. 3 shows interfacial oxygen content of substrates exposed to different substrate surface pre-clean processes.

FIG. 3 shows a graph 300 which compares interfacial oxygen content, expressed in atoms per square centimeter (at/cm$^2$), of different substrates. The substrates included silicon and the germanium oxides, which were subjected to a pre-clean oxide material process. The presence of interfacial oxygen is understood to indicate the presence of contaminants on the substrate surface. The interfacial oxygen content for each substrate was measured after the substrate had been exposed to the respective oxide removal process, and was measured using the Secondary Ion Mass Spectroscopy (SIMS) technique. The same pre-clean process (including deposition of a halogen-containing pre-clean material, sublimation of halogen and silicon-containing material, and subsequent sublimation of halogen and germanium-containing material) was applied to all substrates, with the difference being whether a passivation film was formed between the sublimations of the different materials. The bar labeled "baseline" corresponds to substrates that were subjected to a pre-clean process which did not include formation of a chlorine-containing passivation film. The bars labeled "DCS/HCl" and "$Cl_2$" correspond to substrates that were exposed to a similar pre-clean process, but including formation of a chlorine-containing passivation films using the respectively labeled chlorine-containing gasses. In particular, dichlorosilane and hydrogen chloride, or chlorine gas ($Cl_2$), were supplied into the reaction chamber before sublimation of the halogen and germanium-containing material.

FIG. 3 shows that interfacial oxygen content for the substrate exposed to the baseline process was significantly higher than the interfacial oxygen content for either of the substrates exposed to the pre-clean processes which included formation of chlorine-containing passivation films. Additionally, the substrates exposed to pre-clean processes comprising DCS/HCl and $Cl_2$ demonstrated similar interfacial oxygen content. For example, the substrate exposed to the baseline process demonstrated an interfacial oxygen content of about $5\times10^{12}$ at/cm$^2$, while the substrates pre-cleaned using DCS/HCl and $Cl_2$ demonstrated an interfacial oxygen content less than about $0.25\times10^{12}$ at/cm$^2$.

Figure 4:
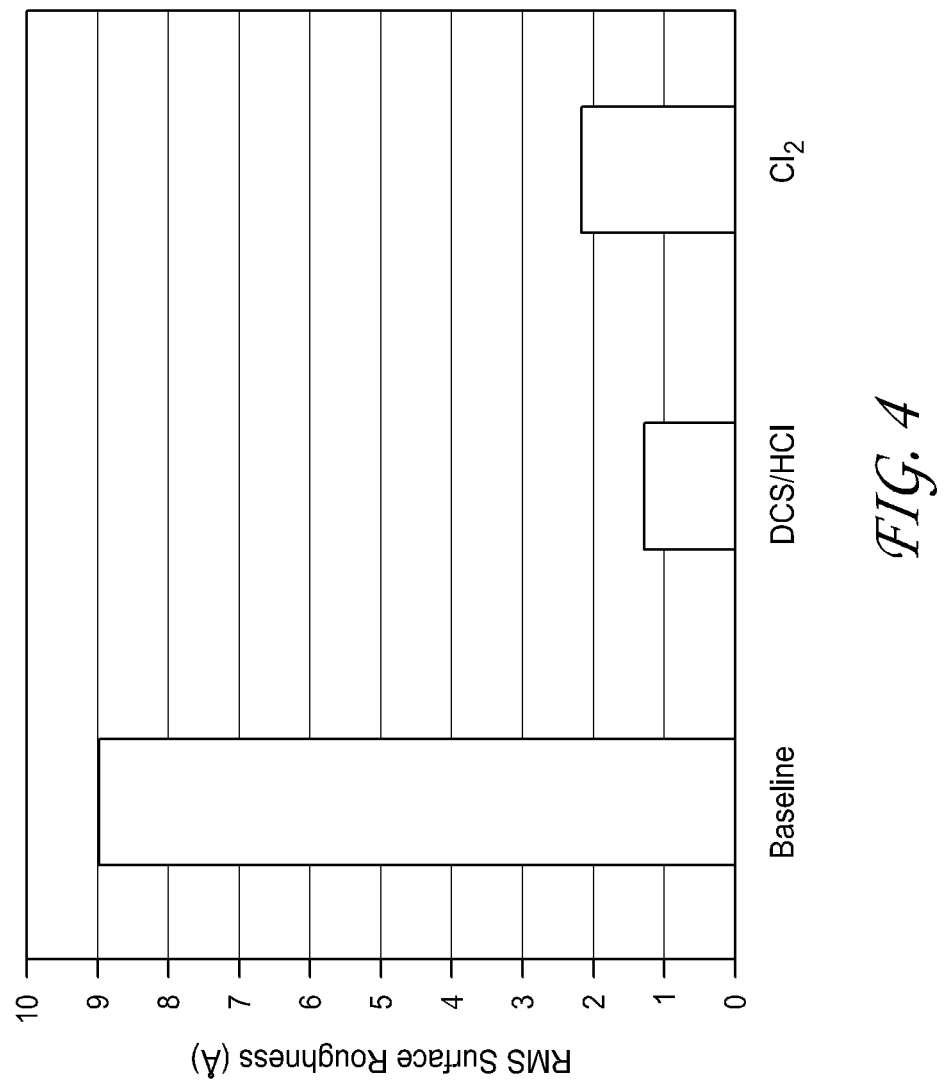
FIG. 4 shows surface roughness of substrates exposed to different substrate surface pre-clean processes.

FIG. 4 shows a graph 400 which compares surface roughness, expressed in angstroms (Å), of different substrates processed as discussed above. The surface roughness for each substrate was measured after the substrate had been exposed to the respective oxide removal process, and was measured using the Atomic Force Microscopy (AFM) technique. As discussed above, the substrate corresponding to the surface roughness labeled "baseline" was subjected to a pre-clean process which did not include formation of a chlorine-containing passivation film. The substrates corresponding to the surface roughness labeled "DCS/HCl" and "$Cl_2$" were exposed to pre-clean processes including formation of chlorine-containing passivation films using the respectively labeled chlorine-containing gasses.

FIG. 4 shows that surface roughness for the substrates exposed to pre-clean process including chlorine containing passivation film advantageously showed significant reduction in surface roughness as compared to the substrate which was subjected to an oxide removal process which did not include a chlorine-containing passivation film. For example, surface roughness for the substrate pre-cleaned using the baseline process measured about 9 angstroms (Å), while the surface roughness for the substrates pre-cleaned using processes comprising chlorine-containing passivation film was about 2 Å or less.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. For example, while providing various advantages when applied to substrates comprising both silicon and germanium, it will be appreciated the pre-clean process disclosed herein may also be applied to silicon substrates, without germanium, or to germanium substrates, without silicon. For example, the pre-clean process may be applied to a silicon or a germanium substrate, respectively, where passivation of the substrate is desired after removal of silicon oxide or germanium oxide, respectively. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A method for integrated circuit fabrication, comprising:
    removing oxide material from a surface of a substrate, wherein the surface comprises silicon and germanium, and wherein removing the oxide material comprises:
        depositing a halogen-containing pre-clean material on the surface;
        selectively sublimating a portion of the halogen-containing pre-clean material disposed over the silicon of the substrate to expose the silicon on the surface; and
        depositing a passivation material on the exposed silicon.

2. The method of claim 1, wherein sublimating the portion of the halogen-containing pre-clean material comprises heating the surface of the substrate to a temperature of 80° C. to 150° C.

3. The method of claim 2, further comprising ramping up a temperature of the surface of the substrate after depositing the halogen-containing pre-clean material.

4. The method of claim 3, wherein the passivation material comprises chlorine, and wherein depositing the passivation material comprises exposing the substrate to a chlorine-containing gas during the ramping up.

5. The method of claim 1, wherein depositing the halogen-containing pre-clean material and sublimating the portion removes silicon and oxygen-containing species from the surface.

6. The method of claim 5, further comprising, after depositing the passivation material, sublimating a remaining portion of the halogen-containing pre-clean material to remove germanium and oxygen-containing species from the surface.

7. The method of claim 6, wherein:
    sublimating the portion of the halogen-containing pre-clean material comprises heating the surface of the substrate to a temperature of 80° C. to 150° C.; and
    sublimating the remaining portion of the halogen-containing pre-clean material comprises heating the surface of the substrate to a temperature of 320° C. to 500° C.

8. The method of claim 1, wherein depositing the passivation material comprises exposing the substrate to at least one of chlorine gas, dichlorosilane, and hydrogen chloride.

9. The method of claim 8, further comprising exposing the substrate to the at least one of the chlorine gas, dichlorosilane, and hydrogen chloride during sublimating the portion of the halogen-containing pre-clean material.

10. The method of claim 1, further comprising sublimating the passivation material.

11. The method of claim 10, wherein sublimating a remaining portion of the halogen-containing pre-clean material comprises sublimating the passivation material.

12. The method of claim 10, wherein sublimating the passivation material is performed at a pressure between 1 mTorr and 50 Torr.

13. The method of claim 1, wherein depositing the halogen-containing pre-clean material comprises exposing the substrate to a halogen-containing gas activated by the remote plasma unit.

14. The method of claim 13, wherein the halogen-containing gas comprises at least one of nitrogen trifluoride, hydrogen fluoride, and diatomic fluorine.

15. The method of claim 13, wherein depositing the halogen-containing pre-clean material further comprises exposing the substrate to a hydrogen-containing gas.

16. The method of claim 15, wherein the hydrogen-containing gas comprises ammonia.

17. The method of claim 15, wherein exposing the substrate to the hydrogen-containing gas comprises:
flowing the hydrogen-containing gas through a transfer tube prior to exposing the substrate to the hydrogen-containing gas; and
heating at least a portion of the transfer tube to a temperature of about 30° C. to about 120° C.

18. The method of claim 1, wherein the surface of the substrate further comprises silicon nitride, and wherein removing the oxide comprises selectively removing the oxide material relative to the silicon nitride at a selectivity of 7:1 to 20:1.

19. The method of claim 1, further comprising removing a second oxide material from the surface of the substrate, wherein removing the second oxide material comprises:
depositing a second halogen-containing pre-clean material on the surface of the substrate;
sublimating a portion of the second halogen-containing pre-clean material; and
depositing a second passivation material.

20. The method of claim 19, wherein the surface of the substrate further comprises silicon nitride, and wherein removing the second oxide comprises selectively removing the second oxide material relative to the silicon nitride at a selectivity of 20:1 to 100:1.

21. The method of claim 1, further comprising depositing an epitaxial layer on the surface of the substrate subsequent to removing the oxide material.

22. A method for integrated circuit fabrication, comprising:
removing an oxide material from a surface of a substrate, wherein the substrate comprises silicon and germanium, and wherein removing the oxide material comprises:
depositing a chlorine-containing passivation material on the silicon on the surface of the substrate; and
removing the chlorine-containing passivation material substantially without etching the substrate.

23. The method of claim 22, wherein removing comprises heating the chlorine-containing passivation material to a temperature less than 600° C.

24. The method of claim 23, wherein the temperature is higher than 380° C.

25. The method of claim 22, wherein depositing the chlorine-containing passivation material comprises exposing the substrate to a chlorine-containing gas comprising at least one of chlorine gas, dichlorosilane, and hydrogen chloride.

26. The method of claim 22 further comprising depositing a halogen-containing pre-clean material on the surface of the substrate and sublimating a portion of the halogen-containing pre-clean material prior to depositing the chlorine-containing passivation material.

27. The method of claim 26, wherein depositing the halogen-containing pre-clean material comprises exposing the substrate to a halogen-containing gas and a hydrogen-containing gas.

28. The method of claim 26, wherein sublimating the portion of the halogen-containing pre-clean material comprises heating the surface of the substrate to a temperature of 80° C. to 150° C.

29. The method of claim 28, further comprising sublimating a remaining portion of the halogen-containing pre-clean material.

30. The method of claim 29, wherein sublimating the remaining portion of the halogen-containing pre-clean material comprises heating the surface of the substrate to a temperature of 380° C. to 600° C.

31. The method of claim 29, wherein sublimating the remaining portion comprises removing the chlorine-containing passivation film.

32. A method for integrated circuit fabrication, comprising:
removing a germanium-containing oxide material from a surface of a substrate, wherein the substrate comprises silicon and germanium, wherein the surface of the substrate comprises silicon-containing oxide material over the silicon of the substrate and germanium-containing oxide material over the germanium of the substrate and wherein removing the germanium-containing oxide material comprises:
forming a halogen and germanium-containing pre-clean material from the germanium-containing oxide material and forming a halogen and silicon-containing pre-clean material from the silicon-containing oxide material;
selectively sublimating the halogen and silicon-containing pre-clean material relative to the halogen and germanium-containing pre-clean material; and
subsequently sublimating the halogen and germanium-containing pre-clean material.

33. The method of claim 32, further comprising depositing a chlorine-containing passivation material prior to sublimating the halogen and germanium-containing pre-clean material.

34. The method of claim 33, wherein depositing the chlorine-containing passivation material comprises depositing the chlorine-containing passivation material on exposed silicon on the surface.

* * * * *